United States Patent [19]

Sepmeyer

[11] 3,985,200

[45] Oct. 12, 1976

[54] BACKGROUND SOUND SYSTEM AND APPARATUS FOR MASKING SPEECH

[76] Inventor: Ludwig W. Sepmeyer, 1862 Comstock Ave., Los Angeles, Calif. 90025

[22] Filed: Aug. 29, 1974

[21] Appl. No.: 501,636

[52] U.S. Cl. ................................ 181/150; 181/151; 181/199

[51] Int. Cl.[2] ...................... H05K 5/00; A47B 81/06

[58] Field of Search ........... 181/150, 151, 199, 149, 181/148, 141

[56] References Cited

UNITED STATES PATENTS

| | | | |
|---|---|---|---|
| 2,744,584 | 5/1956 | Hellon | 181/151 |
| 2,978,060 | 4/1961 | Roberts | 181/151 |
| 2,992,695 | 7/1961 | Everitt | 181/199 |
| 3,236,328 | 2/1966 | Burroughs | 181/151 |
| 3,592.290 | 7/1971 | Armstrong | 181/151 |
| 3,757,889 | 9/1973 | Everitt | 181/199 |

*Primary Examiner*—Stephen J. Tomsky
*Attorney, Agent, or Firm*—Allan M. Shapiro

[57] ABSTRACT

Background sound system provides audiofrequency energy in a large office space for masking speech. The system includes a plurality of downwardly directed speakers in speaker enclosures mounted on the top of the suspended ceiling defining the office space. The speakers are thus directly acoustically coupled with the office space.

7 Claims, 6 Drawing Figures

Fig. 1
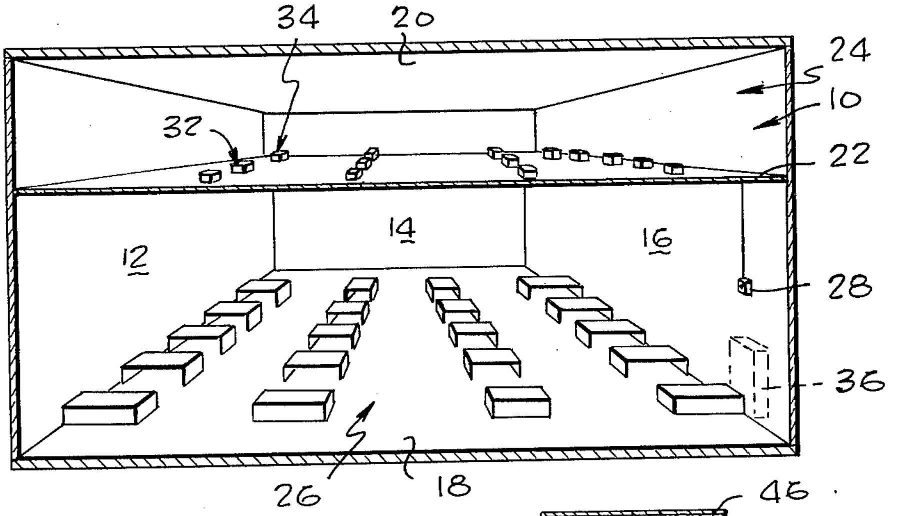
Fig. 2
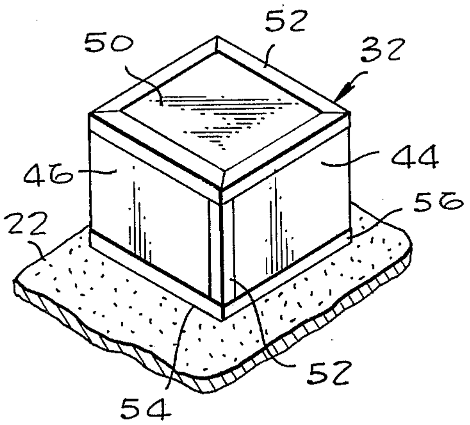
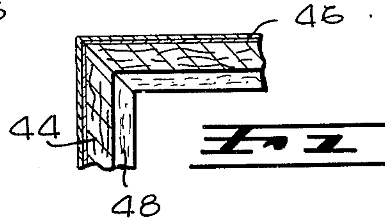
Fig. 6
Fig. 3
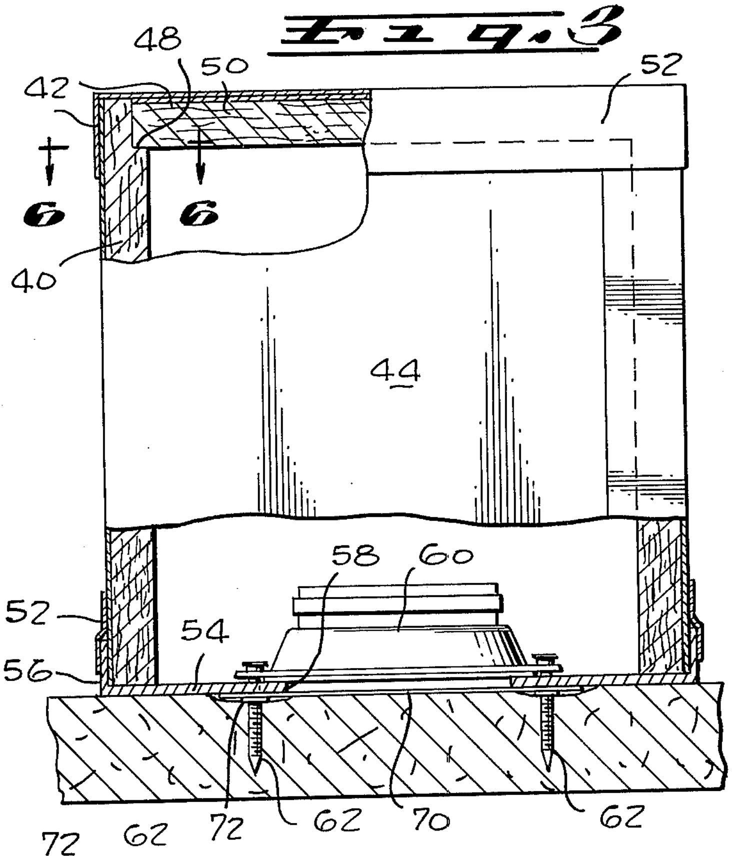
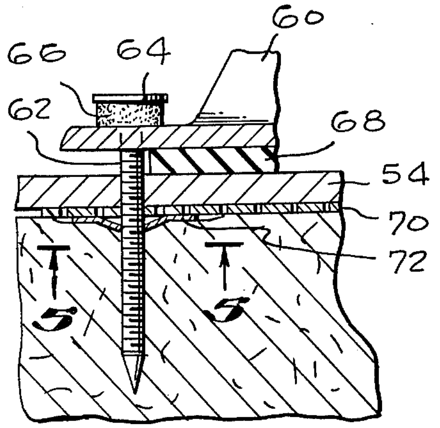
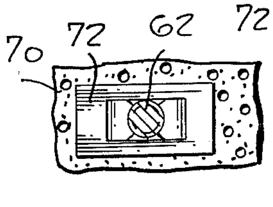
Fig. 4
Fig. 5

BACKGROUND SOUND SYSTEM AND APPARATUS FOR MASKING SPEECH

BACKGROUND OF THE INVENTION

1. Field of the Invention

This invention is directed to a speaker structure and the background sound system in which it is employed, the system being for masking speech sounds in large spaces where there are a plurality of people.

2. Description of the Prior Art

Designers of large office operations have abandoned the practice of placing each desk in its own small room. Instead, today's office arrangement concept is to provide spacious open floors which are shared by many desks. The new concept, when employed to its greatest advantage, affords better efficiency and an informal atmosphere; however, it is desirable to retain one property which is automatically provided by small or individual offices. This property is the privacy of conversation. The conversation may be with another worker or on the telephone. The protection of each worker from the distracting intrusion of noises from adjacent sources, such as conversations, business machines, and telephone ringing, is a critical factor detrimental to this design. The open plan concept has gone beyond the office and is finding acceptance in classrooms and in hospital patient rooms. The specific details of the problem differ from the office requirements, but the basic goal is the same. In the hospital ward, each patient should be isolated from the sounds of the other patients, their conversations, and TV sets. In schools, the problem is more difficult because one large room may be shared by several classes of students. Each class must be acoustically coupled within itself, but each class must be acoustically separated from the adjacent one.

The use of sound-absorbing acoustical material is a basic element in the design of such spaces. Use of carpeting and wall and ceiling acoustical surfaces is common. In addition, panels and sound barriers are individually arranged to aid in the separation of spaces; however these measures cannot provide an adequate solution.

Most of the open-spaced offices are defined above by a ceiling, and above the ceiling is a plenum in which the office services are channeled. Sprinkler piping, water piping, air-conducting duct work, electrical conduits, and the like are routed through the plenum space.

The prior art provides background masking noise, but the noise must be uniformly distributed through the space in order to achieve the satisfactory end results. If the noise is not uniform, masking is ineffective in one area, and a person walking through the room would be subject to different intensities of background noise and thus would become conscious of it. The prior art systems mostly utilize commercial sound system components and then use sound contractors to install the loudspeakers in the plenum space above the open plan office ceilings. The plenum space above the ceilings is usually cluttered with air-conditioning ducts and electrical conduits. The speakers are positioned so that the plenum space is utilized as a mixing chamber for the background noise and, in theory, this mixing chamber distributes the sound over the entire ceiling area. With the utilization of the plenum space as a mixing chamber, in theory, the noise filters down uniformly through the ceiling and into the office space; however, this is only potentially true when the plenum is unobstructed and acoustically hard. The insulated air-conditioning ducts and the other equipment in the plenum interfere with this distribution and thus the plenum does not act as the theoretically uniform mixing chamber. Now, individualized positioning of the speakers by field acoustic technicians is required, in order that the masking sound be uniform in the office space below.

SUMMARY OF THE INVENTION

In order to aid in the understanding of this invention, it can be stated in essentially summary form that it is directed to an apparatus for background sound system for masking speech and the system in which it is employed. The apparatus comprises a loudspeaker which is positionable on the top of a suspended ceiling and directed downwardly, while the system comprises a plurality of such speakers substantially uniformly spaced and powered to provide speech-masking sounds in the space below the ceiling.

It is thus an object of this invention to provide an apparatus for a background sound-masking system so that, when the apparatus is mounted on the top of the ceiling which separates the room from a plenum space, the apparatus is not dependent upon the acoustical quality of the plenum space. It is another object of the invention to provide a completely modular system which can be easily installed in the field by acoustically inexperienced personnel and still achieve an optimum system. It is another object of the invention to provide a background masking system which can also be used for paging and background music distribution. It is a further object to provide a loudspeaker cabinet which can be directly mounted in a downwardly oriented position on the top of the ceiling panel for direct acoustical coupling to the space below the panel.

The features of the present invention which are believed to be novel are set forth with particularity in the appended claims. The present invention, both as to its organization and manner of operation, together with further objects and advantages thereof, may be understood best by reference to the following description taken in connection with the accompanying drawings.

BRIEF DESCRIPTION OF THE DRAWINGS

FIG. 1 is a perspective view of a room employing the background system for masking speech of this invention.

FIG. 2 is an isometric view of one of the speaker enclosures positioned as it is about to be placed down into engagement with a ceiling panel.

FIG. 3 is an enlarged side elevational view of a speaker enclosure, with parts broken away and parts taken in section, showing the speaker enclosure mounted in association with a ceiling panel.

FIG. 4 is an enlarged detailed section showing the mounting details of the speaker enclosure.

FIG. 5 is a detail section taken generally along the line 5—5 of FIG. 4 showing a portion of the enclosure face.

FIG. 6 is a section taken generally along the line 6—6 of FIG. 3 showing the corner detail.

DESCRIPTION OF THE PREFERRED EMBODIMENT

FIG. 1 illustrates a room 10 in which is employed the apparatus for background sound system for masking speech, in accordance with this invention. The room is provided with four conventional walls, three of which are seen at 12, 14 and 16; floor 18; and roof 20. Suspended ceiling 22 divides the room 10 into plenum 24 and office space 26. As is seen in FIG. 1, the office space is of the open-plan arrangement.

In order to achieve speech privacy in open-plan offices, such as office space 26, several acoustical requirements must be met. The ceiling 22 should be as high as possible and be very highly absorptive, in order to minimize the sound energy reaching the unintended listener by way of the ceiling-reflected path. Furthermore, absorptive surfaces should also be employed on the walls and the floors. Background masking noise is employed to mask the speech sounds which do reach the unintended listeners. In order to be as unobjectionable as possible and to maximize the masking, the background noise must have a smooth frequency characteristic and be completely random. For maximum masking efficiency, the spectrum shape of the background noise should conform to the spectrum shape of speech. Additionally, the background masking sound system should provide a substantially amplitude characteristic throughout the entire office space 26 so that, as a person walks through the office space, he is not made conscious of the background masking sounds, as he would be if the perceived amplitude were substantially different in different locations.

Speakers 32, 34 and additional speakers are positioned in the plenum 24, but are mounted on the top of the suspended ceiling and are directed downwardly. The ceiling structure is of mineral wool or preferably fibreglass ceiling panels hung in suitable suspension rails. These are suitably transmissive to sound so that the speakers downwardly positioned thereon are directly coupled with the room space.

Electronic unit 36 is a supply for the speakers. As a preferred example, it is located in an adjacent space and contains a white noise generator, followed by a filter network which substantially restricts the bandwidth to that of speech and shapes the amplitude profile across the speech band to the desired values. This signal goes to a power amplifier. The output comprises one or more power amplifiers with the speakers, including speakers 32 and 34, connected to the power amplifier output. The number of power amplifiers is dependent upon their output power and the number of speakers to be served. A plurality of parallel power amplifiers is anticipated. Furthermore, redundancy to the system can be employed to achieve maximum reliability. Controller 28 is mounted in the space 26 so that output level of the amplifiers into the office space is controllable.

Speakers 32 and 34 are positioned on top of ceiling 22 in a downwardly directed orientation. They are preferably arranged on 8 to 10-foot centers in order to maintain a substantial uniformity of masking noise volume throughout the office space. Each of the speakers is connected to the amplifier output so that the entire system is controlled by controller 28.

Each of the speaker enclosures is identical, and the particular structural detail and characteristics of a speaker enclosure described with respect to speaker enclosure 32, shown in further detail in FIGS. 2 through 6.

For reasons of economy, superb acoustic qualities, and its fireproof characteristics, speaker enclosure 32 is comprised of sides and top formed of flat ductboard. Ductboard is an impregnated fibreglass material which is sufficiently rigid to act as a structural material, yet is light and sound-absorbent. The impregnated fibreglass is shown at 40 in FIG. 6 and, in order to protect the exterior of the ductboard, an aluminum foil layer 42 is secured thereto, preferably by the same binder as holds the fibreglass together. The structure is formed in large sheets and is cut to size by ordinary machinery. The preferred ductboard is Airduct Material which is Underwriters' Laboratories Approved as Class 1 (form B), issue 4571. A preferred example of the material employed which is suitable for the purpose and meets this Underwriters' Laboratories approval is flat ductboard type 475-FR. Speaker enclosure 40 has four sides, two of which are seen at 44 and 46. As seen in FIG. 6, the sides are all formed from a single continuous sheet which is mitered at the corners to accommodate the corner bend. As seen in FIGS. 3 and 6, rabbet 48 around the top edge of all four of the sides forms a seat for top 50. The sides and top are secured together by means of pressure-sensitive aluminum duct tape 52 which binds all of the adjacent edges.

Bottom cover 54 is a sheet metal cover with upturned flanges 56 which engage upward around the lower edges of the sides. Bottom cover 54 is also preferably held in place by duct tape.

Bottom cover 54 is provided with an opening 58, and loudspeaker 60 is positioned within the enclosure and overlying the opening. Loudspeaker 60 is attached to the interior of the enclosure by means of four ring nails 62. As is best seen in FIG. 4, each ring nail has a head 64, and under each ring nail head is located a resilient rubber-like washer 66. The washer engages over the frame of the speaker to isolate the speaker frame. Gasket 68 engages between the face of the speaker frame and bottom cover 54. Ring nail 62 extends through the lower cover and through perforated plate 70 which extends across opening 58. At the front of perforated plate 70, the ring nail engages through push-on fastener 72, see FIGS. 4 and 5, so that the speaker is clamped to bottom cover 54. Perforated plate 70 is provided to protect the cone of loudspeaker 60 against damage. The ring nails protrude sufficiently far to extend about two-thirds the way through the thickness of the acoustical suspended ceiling panel 22. The natural acoustical and structural properties of the flat ductboard provide a superior enclosure, but other materials having similar properties are also useful.

Depending on ceiling height and ceiling suspension rail spacing, loudspeakers are placed from 8 to 10 feet on centers. With the loudspeaker enclosure mounting system, each speaker enclosure is mounted by impaling the speaker enclosure onto the back of the ceiling panel at the desired place. The loudspeaker is provided with two leadwires with polarized connectors. These leadwires are connected to a harness which extends from the electronic module 36. The positioning of the speakers is not dependent upon the conditions in plenum 24, but the speakers are uniformly spaced to provide a uniform distribution of the masking sound into office space 26. In FIG. 1, it is seen that the several speakers are distributed to provide uniform sound distribution. The speaker installation can be accomplished by the ceiling installers, because no acoustical judgment is necessary for their proper placement. They can simply be uniformly spaced and will provide desirable results.

In addition to the use of the speakers to provide the background masking noise, the speakers can also be employed in paging and in background music systems, and all three can be accomplished at the same time with suitable electronic connections.

This invention having been described in it preferred embodiment, it is clear that it is susceptible to numerous modifications and embodiments within the ability of those skilled in the art and without the exercise of the inventive faculty. Accordingly, the scope of this invention is defined by the scope of the following claims.

What is claimed is:

1. An apparatus for background sound systems for masking speech in a space to be occupied by people, said apparatus comprising:

- a ceiling of sound transmissive material suspended over said space;
- a speaker enclosure box having a bottom wall, a speaker opening in said wall, said enclosure box being mounted on top of said ceiling so that said speaker opening is against said ceiling; and
- a speaker secured to said enclosure box and positioned to direct sound out of said speaker opening and into said ceiling so that the sound from said speaker is transmitted through said ceiling into said people-occupied space.

2. The apparatus of claim 1 wherein said speaker is secured to said enclosure box by means of a plurality of nails extending through said speaker and through said wall of said enclosure box, said nails extending exteriorly of said enclosure box for engagement in the ceiling to hold the speaker enclosure in place in a downwardly-directed orientation.

3. The apparatus of claim 2 where said enclosure box is formed of four sides beveled to each other and secured together by means of a pressure-sensitive adhesive attached tape.

4. The apparatus of claim 3 wherein said four sides are rabbeted adjacent their top edges and a top is seated in said rabbet and is secured therein by means of pressure-sensitive adhesive attached tape.

5. The apparatus of claim 2 wherein the bottom of said enclosure box has a metallic bottom cover with upturned flanges engaging upward on the sides of said box.

6. The apparatus of claim 2 wherein said nails engage through the frame of said speaker and engage respective fasteners lying against the outside of said enclosure box wall to clamp the speaker to the enclosure box wall.

7. The apparatus of claim 6 wherein a perforated plate is positioned over said speaker and over said opening and under said fastener so that said plate is secured in a position to prevent damage to said speaker, and said plate is secured in place by said nails.

* * * * *